United States Patent
Furmanek (10) Patent No.: US 10,605,478 B1
(45) Date of Patent: Mar. 31, 2020

(54) CONTROL CIRCUITS FOR SUPPLYING CURRENT TO ACTUATE GAS VALVES IN HVAC SYSTEMS

(71) Applicant: EMERSON ELECTRIC CO., St. Louis, MO (US)

(72) Inventor: Daniel L. Furmanek, Ballwin, MO (US)

(73) Assignee: EMERSON ELECTRIC CO., St. Louis, MO (US)

(*) Notice: Subject to any disclaimer, the term of this patent is extended or adjusted under 35 U.S.C. 154(b) by 0 days.

(21) Appl. No.: 16/571,431

(22) Filed: Sep. 16, 2019

Related U.S. Application Data (60) Provisional application No. 62/858,573, filed on Jun. 7, 2019.

(51) Int. Cl.
| H03B 1/00 | (2006.01) |
| H03K 3/00 | (2006.01) |
| F24F 11/88 | (2018.01) |
| F23N 3/08 | (2006.01) |

(52) U.S. Cl.
CPC ............. F24F 11/88 (2018.01); F23N 3/085 (2013.01); F23N 2235/10 (2020.01)

(58) Field of Classification Search
CPC .. F24F 11/88; H02J 9/062; H02J 9/061; H02J 9/06; H02J 9/08; H01H 2300/018; G11B 5/022; G11B 5/02; H03K 17/0822; H03K 17/64; H03K 17/662
USPC .............................................. 327/110; 307/64
See application file for complete search history.

(56) References Cited

U.S. PATENT DOCUMENTS

| 3,943,416 A | 3/1976 | Degenhart |
| 4,360,338 A | 11/1982 | Katchka |
| 4,432,034 A | 2/1984 | Wohlert et al. |
| 2012/0199660 A1* | 8/2012 | Warren .................. F24D 19/10 236/1 C |
| 2014/0312801 A1* | 10/2014 | Kuo ....................... H05B 45/60 315/291 |
| 2014/0347901 A1* | 11/2014 | Kim ........................ H02M 1/32 363/126 |
| 2017/0288585 A1* | 10/2017 | Pant ........................ H02P 6/085 |
| 2017/0317594 A1* | 11/2017 | Lind ....................... H02M 1/36 |
| 2019/0056131 A1* | 2/2019 | Warren .................. G05D 23/00 |

FOREIGN PATENT DOCUMENTS

| CN | 201204110 | 3/2009 |

* cited by examiner

*Primary Examiner* — Anh Q Tra
(74) *Attorney, Agent, or Firm* — Harness, Dickey & Pierce, P.L.C.; Anthony G. Fussner (57) ABSTRACT

A control circuit for supplying current to actuate a gas valve in an HVAC system includes a solenoid coil adapted to selectively open and close the gas valve, input terminals coupled to receive an AC power input, and a rectifier bridge coupled between the input terminals and the solenoid coil. The rectifier bridge includes four nodes and at least four diodes. The control circuit also includes a capacitor, and a switch coupled in series with the capacitor between a ground potential and a node defined between the rectifier bridge and the solenoid coil. The switch is coupled to selectively electrically connect and disconnect the capacitor in parallel with the solenoid coil to allow the capacitor to smooth the voltage rectified by the rectifier bridge when the switch is on and to inhibit smoothing of the rectified voltage by the capacitor when the switch is off.

20 Claims, 9 Drawing Sheets

CONTROL CIRCUITS FOR SUPPLYING CURRENT TO ACTUATE GAS VALVES IN HVAC SYSTEMS

CROSS-REFERENCE TO RELATED APPLICATION

This application claims the benefit and priority of U.S. Provisional Application No. 62/858,573 filed Jun. 7, 2019, which is incorporated herein by reference in its entirety.

FIELD

The present disclosure generally relates to control circuits for supplying current to actuate gas valves in HVAC systems.

BACKGROUND

This section provides background information related to the present disclosure which is not necessarily prior art.

An AC voltage may be full-wave rectified with an optional smoothing capacitor, and output to a DC solenoid coil to actuate a gas valve. The solenoid coil may be actuated using an opening magnetic force, and a holding magnetic force. The solenoid coil is generally sized for the opening magnetic force, and may be oversized for the holding magnetic force. Copper wire may be used to reduce the coil resistance so the coil does not overheat during the holding phase.

DRAWINGS

The drawings described herein are for illustrative purposes only of selected embodiments and not all possible implementations, and are not intended to limit the scope of the present disclosure.

Corresponding reference numerals indicate corresponding (although not necessarily identical) parts throughout the several views of the drawings.

DETAILED DESCRIPTION

Example embodiments will now be described more fully with reference to the accompanying drawings.

Example embodiment control circuits disclosed herein may allow for supplying two different current values to a direct current (DC) solenoid coil load to actuate a gas valve in an HVAC system. Initially, the current output by the circuit has a higher value suitable for picking or opening the gas valve, and after a time delay elapses, the output current is reduced to a lower value suitable for holding the valve open.

Solenoid force versus stroke curves indicate that the force generated by a magnetic solenoid actuator is lowest when the magnetic air gap is the largest. This is typically the case before the armature has moved, and the armature is farthest away from its home position.

For gas valves in HVAC systems, this position is typically set as the closed/de-energized position. Therefore, solenoid coils powered by a DC source may be sized to allow the actuator to begin moving when the actuator is in its weakest position, and to hold the actuator when the actuator is in its strongest position.

If two separate currents are applied to the solenoid coil by a control circuit, then a larger output current can be used for the picking or opening phase of the solenoid coil, and after a time delay elapses, a smaller output current can be used for the holding phase of the solenoid coil.

The coil may be designed (e.g., sized, etc.) to take advantage of the two different output currents supplied by the control circuit. For example, a smaller coil may be optimized for the holding phase, as opposed to using a larger coil optimized for the opening phase.

The control circuit that controls the current supplied to the gas valve may be located in the gas valve itself, may be part of an integrated furnace control (IFC), etc. In some embodiments, the control circuit may include a selectively enabled smoothing capacitor that can be selectively connected and disconnected to control the current value by smoothing or not smoothing the output current.

Figure 1:
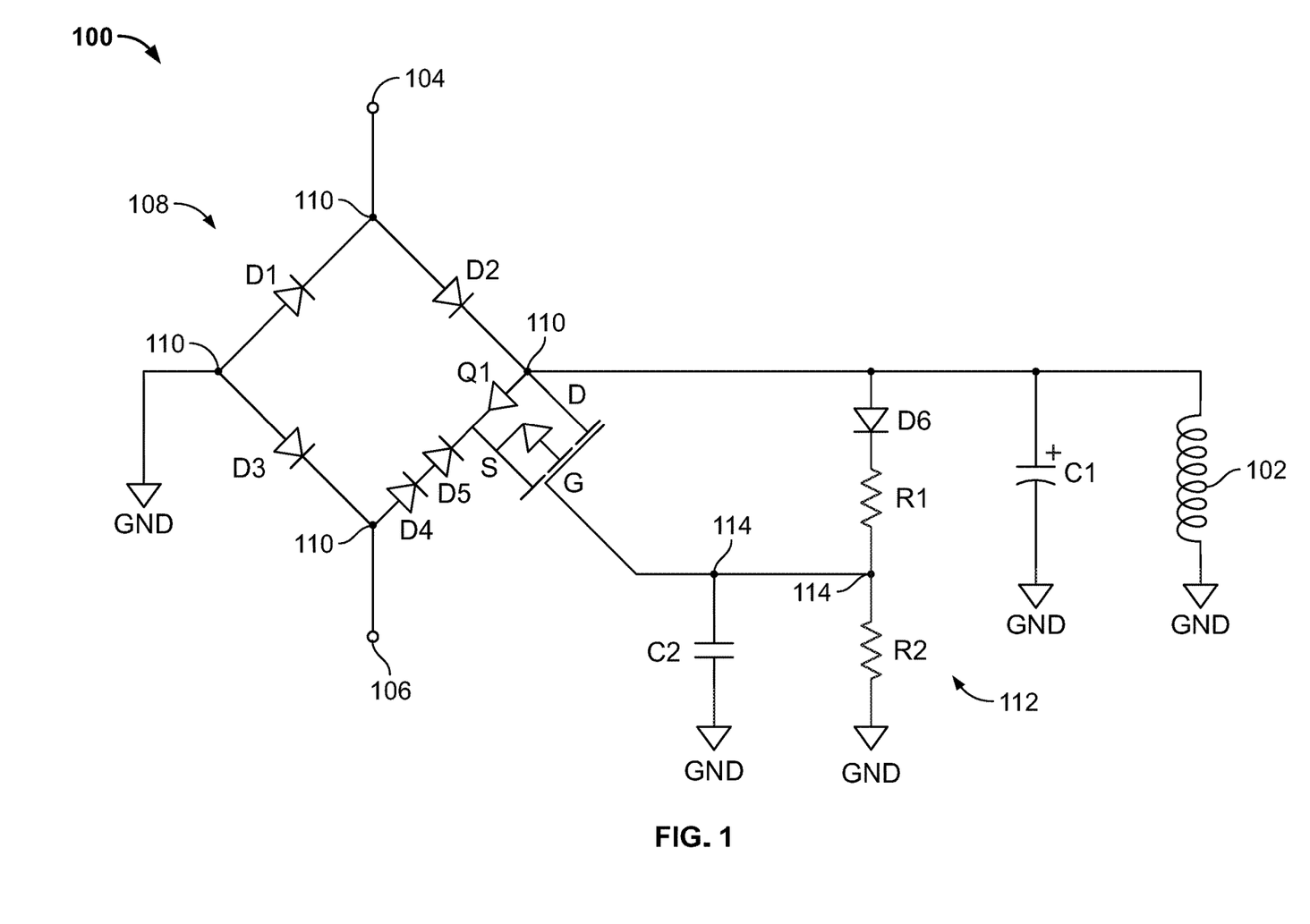
FIG. 1 is a wiring diagram of a control circuit for supplying current to actuate a gas valve in an HVAC system according to an example embodiment of the present disclosure.

A control circuit for supplying current to actuate a gas valve in an HVAC system according to one example embodiment of the present disclosure is illustrated in FIG. 1, and is referenced generally by 100. As shown in FIG. 1, the control circuit 100 includes a solenoid coil 102 (e.g., an actuator, etc.) adapted to selectively open and close the gas valve in the HVAC system.

The control circuit 100 also includes input terminals 104 and 106 coupled to receive an alternating current (AC) power input. The control circuit 100 further includes a rectifier bridge 108 coupled between the input terminals 104, 106 and the solenoid coil 102 to supply current to the solenoid coil 102. The rectifier bridge 108 includes four nodes 110 and at least four diodes D1, D2, D3, and D4 each connected between a corresponding pair of the four nodes 110.

The control circuit 100 also includes a switch Q1 coupled between one of the pairs of the four nodes 110 of the rectifier bridge 108 to selectively change the rectifier bridge 108 from a full-wave rectifier when the switch Q1 is on to a half-wave rectifier when the switch Q1 is off.

The control circuit 100 further includes a timing circuit 112 coupled to control switching operation of the switch Q1 by allowing the switch Q1 to maintain an on state when AC power is first applied to the input terminals 104, 106, and turning off the switch Q1 after a specified time delay elapses.

The control circuit 100 is coupled to supply a first current to the solenoid coil 102 when the switch Q1 is on and the rectifier bridge 108 is operating as a full-wave rectifier. The control circuit 100 supplies a second current to the solenoid coil 102 when the switch Q1 is off and the rectifier bridge 108 is operating as a half-wave rectifier.

A value of the first current (e.g., when the switch Q1 is on for full-wave rectification) may be greater than a value of the second current (e.g., when the switch Q2 is off for half-wave rectification). For example, the value of the first current may be greater than or equal to a first threshold for opening the gas valve via the solenoid coil 102.

A value of the second current may be less than the first threshold and greater than or equal to a second threshold for holding the gas valve in an open position via the solenoid coil 102. Therefore, the first current may provide a higher current value capable of opening the gas valve (e.g., because opening the gas valve may require more current than holding the gas valve in an open position), while the second current provides a lower current value suitable for holding the gas valve in the open position.

As shown in FIG. 1, the switch Q1 may be a metal-oxide semiconductor field-effect transistor (MOSFET), such as a p-channel MOSFET. In other embodiments other suitable switching elements (e.g., bipolar-junction transistors (BJTs), etc.) may be used to selectively operate the rectifier bridge 108 as either a full-wave rectifier or a half-wave rectifier.

The timing circuit 112 includes two resistors R1 and R2, a capacitor C2, and a diode D6. The resistors R1, R2 and the capacitor C2 are coupled in a resistor-capacitor (RC) circuit arrangement. The RC circuit has a specified time constant corresponding to values of the resistors R1, R2 and the capacitor C2. The time constant of the RC circuit may correspond to the specified time delay for turning off the switch Q1.

For example, a gate G of the switch Q1 is coupled to a node 114 defined between the resistors R1, R2 and the capacitor C2. The switch Q1 may initially be held in an on state due to a lack of charge on the capacitor C2 when power is first applied to the input terminals 104, 106. The switch Q1 is positioned in a leg of the rectifier bridge 108, so turning on the switch Q1 may allow the rectifier bridge 108 to act as a full-wave rectifier.

The voltage on the capacitor C2 will rise over time, and reach a threshold value after a specified time delay elapses according to a time constant of the RC circuit. Once the voltage on capacitor C2 reaches the threshold, the switch Q1 will turn off and the rectifier bridge 108 will act as a half-wave rectifier. The diode D5 is an optional diode and may be used to facilitate maintaining the switch Q1 in an off state for all or approximately all of the time that the capacitor C2 is charged at or above the threshold.

As shown in FIG. 1, the resistors R1 and R2 are coupled in series with the diode D6 between the rectifier bridge 108 and a ground potential (GND). A first terminal of the capacitor C2 is coupled with the ground potential (GND). A second terminal of the capacitor C2 is coupled between the switch Q1 and the node 114 defined between the two resistors R1 and R2. In other embodiments, the timing circuit 112 may include more or less resistors, capacitors, and/or diodes, which may be connected with one another in other circuit arrangements.

The control circuit 100 includes a smoothing capacitor C1. The smoothing capacitor C1 includes a first terminal coupled with a ground potential and a second terminal coupled between the solenoid coil 102 and the rectifier bridge 108. Therefore, the output voltage may be full-wave rectified and smoothed by the smoothing capacitor C1 to provide a higher average current during picking or opening of the gas valve, and the output voltage may be half-wave rectified and smoothed by the smoothing capacitor to provide a lower average current during the holding phase of the gas valve. In some embodiments, excessive output voltage ripple may be present at the smoothing capacitor C1, which may reduce a life of the capacitor C1.

As mentioned above, a gas valve assembly may include a gas valve with the control circuit located in the gas valve. In other embodiments, a furnace control assembly may include an integrated furnace control (IFC), with the control circuit located in the furnace control.

Figure 2:
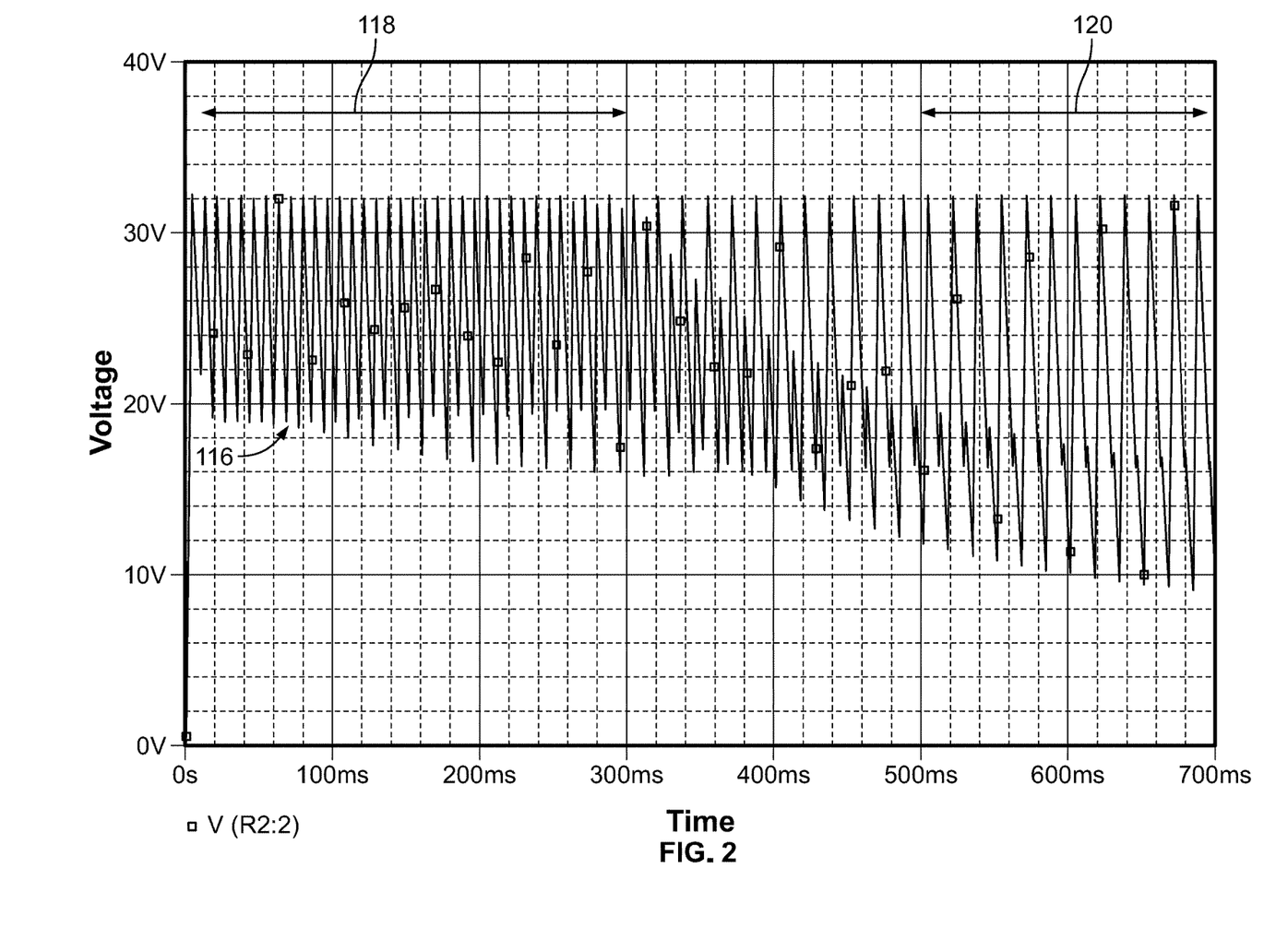
FIG. 2 is a line graph of an example voltage (in volts (V)) supplied by the control circuit of FIG. 1 over time (in milliseconds (ms))

FIG. 2 illustrates a line graph of an example output voltage 116 (in volts (V)) supplied by the control circuit 100 to the gas valve over time (in milliseconds (ms). As shown in FIG. 2, the output voltage 116 is full-wave rectified to provide a higher average voltage during the opening or picking phase 118.

After the specified time delay elapses (which may correspond to an RC time constant of the RC circuit), the output voltage 116 is half-wave rectified to provide a lower average voltage during the holding phase 120.

Figure 3:
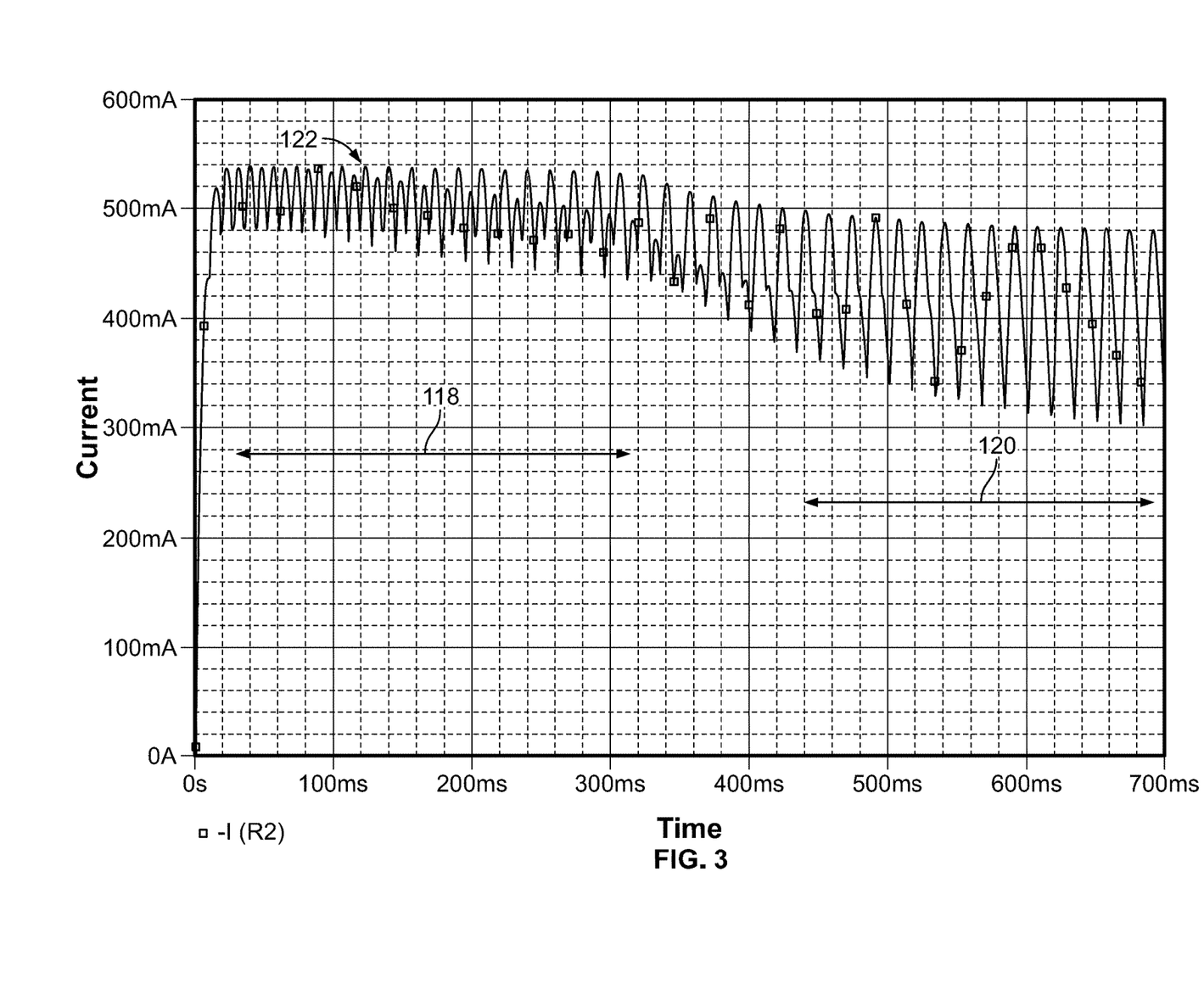
FIG. 3 is a line graph of an example current (in milliamps (mA)) supplied by the control circuit of FIG. 1 over time (ms)

FIG. 3 illustrates a line graph of an example output current 122 (in milliamps (mA)) supplied by the control circuit 100 to the gas valve over time (ms). As shown in FIG. 3, the output current 122 has a higher average value (e.g., due to the full-wave rectification) during the opening or picking phase 118.

After the specified time delay elapses, the output current 122 has a lower average value (e.g., due to the half-wave rectification) during the holding phase 120. The example voltage and current values and timings in FIGS. 2 and 3 are provided for purposes of illustration only, and other embodiments may have higher or lower voltages and currents, longer or shorter holding and opening or picking phases, etc.

Figure 4:
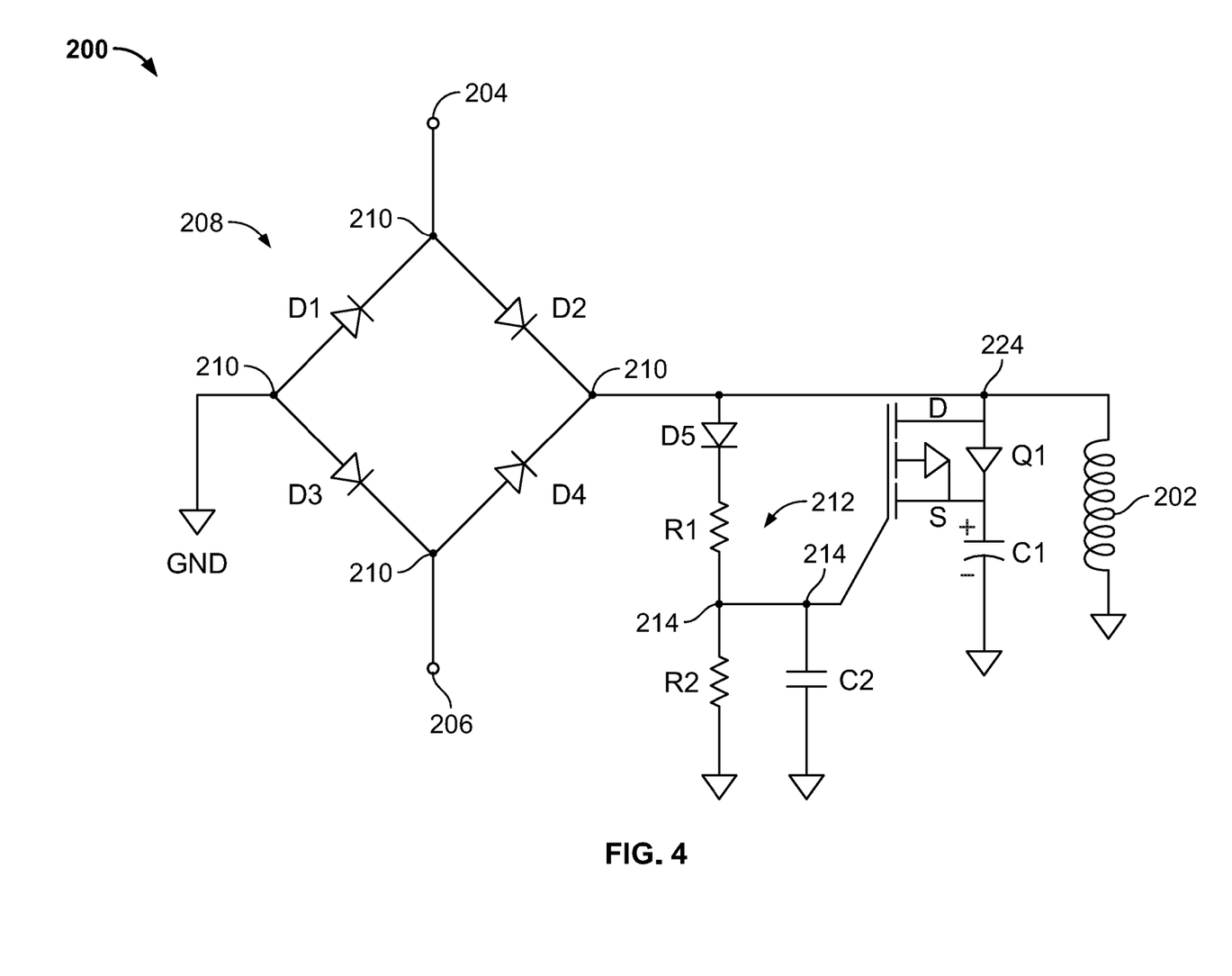
FIG. 4 is a wiring diagram of a control circuit including a selectively enabled smoothing capacitor according to another example embodiment of the present disclosure.

A control circuit 200 for supplying current to actuate a gas valve in an HVAC system is illustrated in FIG. 4, according to another example embodiment of the present disclosure. The control circuit 200 includes a solenoid coil 202 adapted to selectively open and close the gas valve in the HVAC system.

The control circuit 200 also includes input terminals 204 and 206 to receive an alternating current (AC) power input. The control circuit 200 further includes a rectifier bridge 208 coupled between the input terminals 204, 206 and the solenoid coil 202 to supply current to the solenoid coil 202.

A switch Q1 is coupled in series with a capacitor C1 (e.g., a smoothing capacitor, etc.) between a ground potential and a node 224 defined between the rectifier bridge 208 and the solenoid coil 202. The switch Q1 is coupled to selectively allow the capacitor C1 to smooth the voltage rectified by the rectifier bridge 108 when the switch Q1 is on, and to inhibit smoothing of the rectified voltage by the capacitor C1 when the switch Q1 is off.

A timing circuit 212 is coupled to control switching operation of the switch Q1 by allowing the switch Q1 to maintain an on state when AC power is first applied to the input terminals 204, 206, and turning off the switch Q1 after a specified time delay elapses.

The timing circuit 212 includes two resistors R1 and R2, a diode D5, and a capacitor C2 (e.g., a timing capacitor, etc.). The resistors R1, R2 and the capacitor C2 are connected in an RC circuit arrangement. The specified time delay for disconnecting the capacitor C1 may correspond to an RC time constant of the RC circuit arrangement.

For example, a gate of the switch Q1 is coupled to a node 214 defined between the resistors R1, R2 and the capacitor C2. The switch Q1 may be a p-channel MOSFET that defaults to an on state when voltage is first applied to the input terminals 204 and 206. This connects the capacitor C1 to the node 224 to smooth the output voltage, thereby leading to a higher average output current for picking or opening the gas valve.

After the capacitor C2 charges to a threshold value according to an RC time constant of the RC circuit (which may correspond to the specified time delay for smoothing the output voltage), the switch Q1 is turned off to disconnect the capacitor C1. Once the capacitor C1 is disconnected, the output voltage is no longer smoothed by the capacitor C1, leading to a lower average current during the holding phase of the gas valve. Disconnecting the capacitor C1 during the holding phase may increase the life of the capacitor C1.

The resistors R1 and R2 are coupled in series between with the diode D5 between the rectifier bridge 208 and a ground potential. A first terminal of the timing capacitor C2 is coupled with the ground potential. A second terminal of the timing capacitor C2 is coupled between the switch Q1 and the node 214 defined between the two resistors R1 and R2.

As shown in FIG. 4, the control circuit 200 includes four diodes D1, D2, D3, and D4 (e.g., rectifier diodes DIN4935, etc.) positioned between four nodes 210 in a bridge arrangement. The diode D5 may be a DIN4148 diode. Example component values may be 22 kΩ(kiloohms) for the resistor R1, 2 MΩ (megaohms) for the resistor R2, 150 uF-220 uF (microfarads) for the capacitor C1, 2.2 uF for the capacitor C2, a 60 V rated FET for the switch Q1, etc. These values are provided for purposes of illustration only, and other embodiments may have other component values, components coupled in other circuit arrangements, etc. In some embodiments, the component values and resulting voltage parameters may be selected to avoid exceeding a maximum allowable voltage across the switch Q1, etc.

Figure 5:
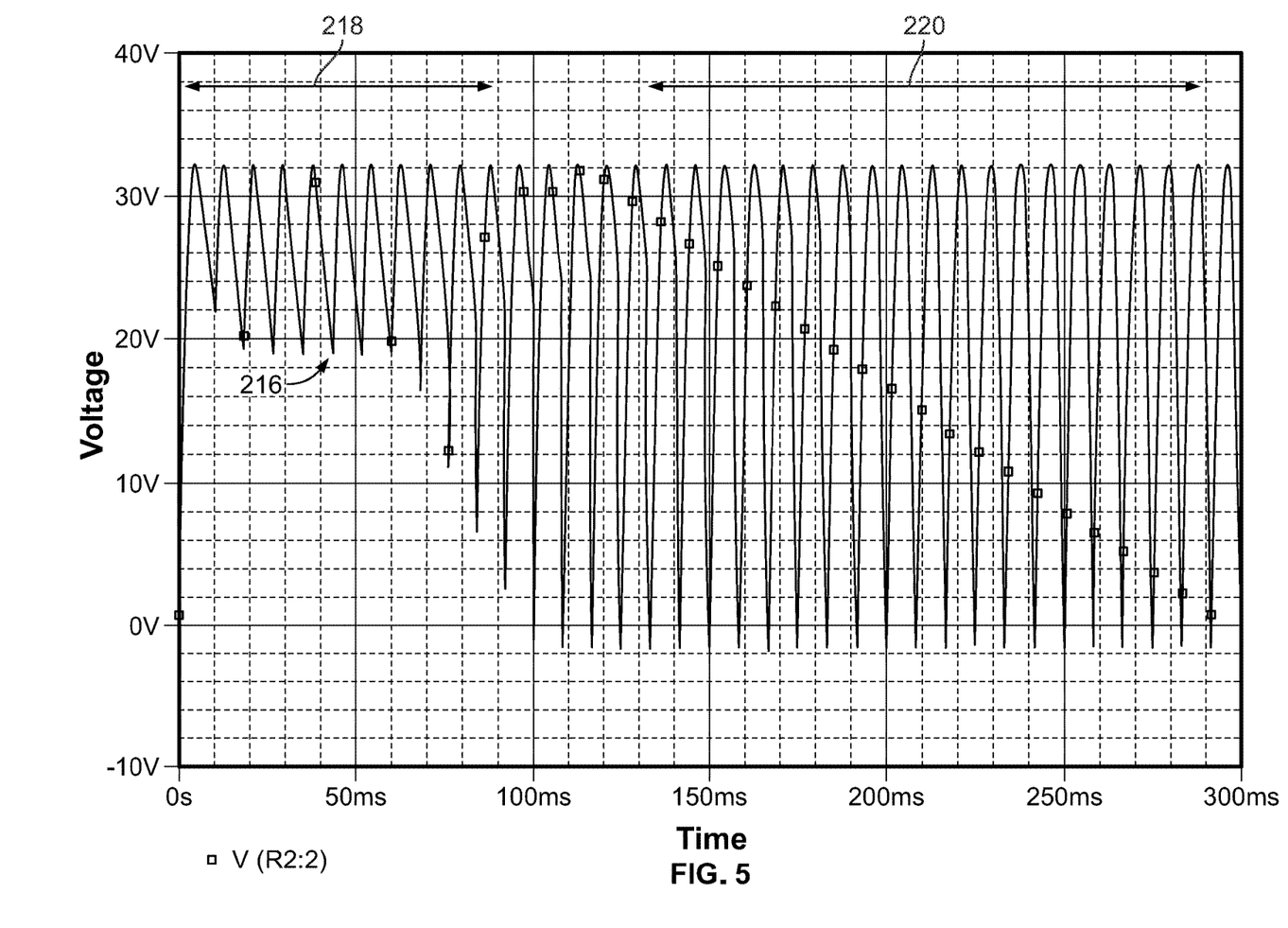
FIG. 5 is a line graph of an example voltage (V) supplied by the control circuit of FIG. 4 over time (ms)

FIG. 5 illustrates a line graph of an example output voltage 216 supplied by the control circuit 200 to the gas valve over time. As shown in FIG. 5, the output voltage 216 is smoothed by the capacitor C1 to provide a higher average voltage during the opening or picking phase 218.

After the specified time delay elapses (which may correspond to an RC time constant of the RC circuit), the output voltage 216 is no longer smoothed (e.g., due to disconnection of the capacitor C2), to provide a lower average voltage during the holding phase 220.

Figure 6:
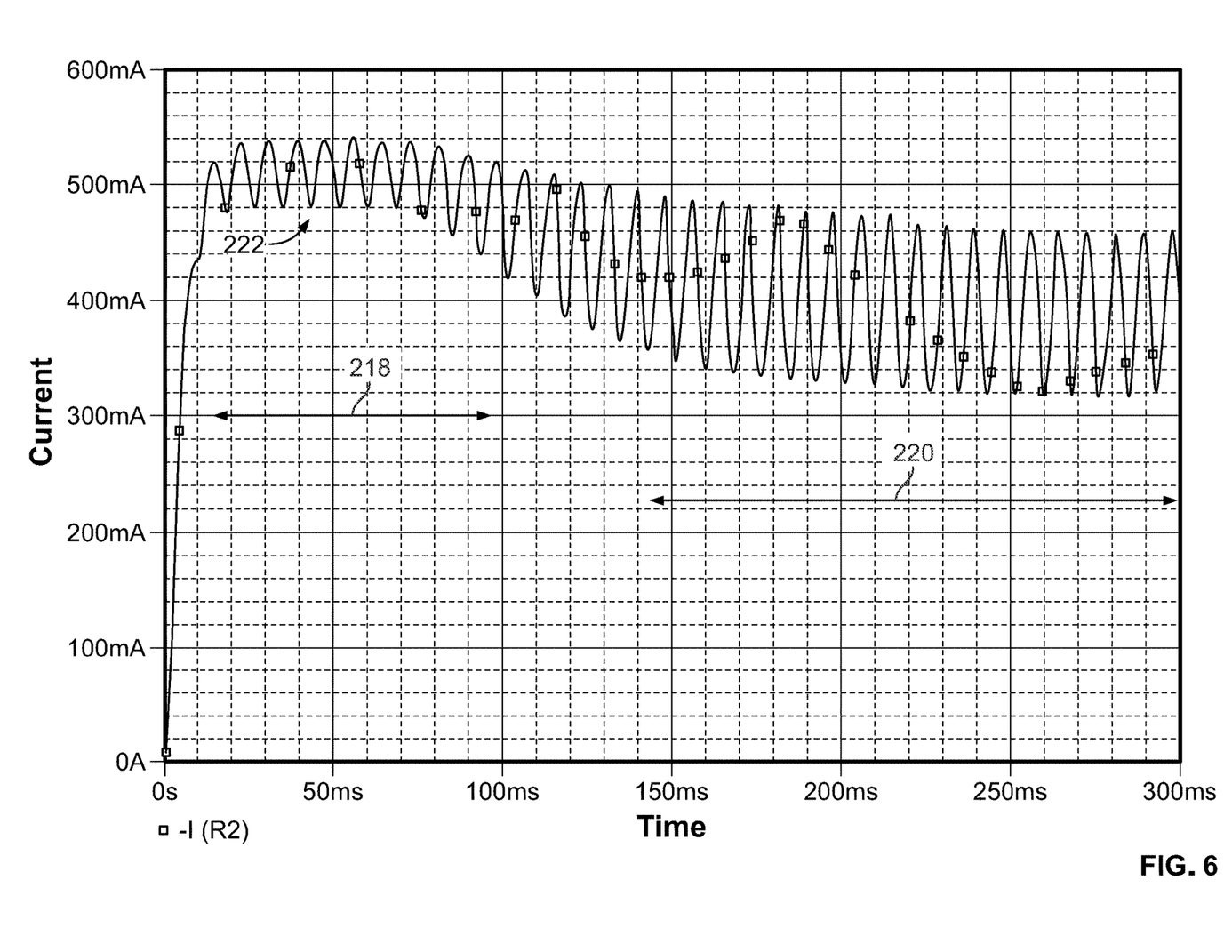
FIG. 6 is a line graph of an example current (mA) supplied by the control circuit of FIG. 4 over time (ms)

FIG. 6 illustrates a line graph of an example output current 222 supplied by the control circuit 200 to the gas valve over time. As shown in FIG. 6, the output current 222 has a higher average value (e.g., due to the smoothing capacitor C1) during the opening or picking phase 218.

After the specified time delay elapses, the output current 222 has a lower average value (e.g., due to disconnection of the smoothing capacitor C1) during the holding phase 220. The example voltage and current values and timings in FIGS. 5 and 6 are provided for purposes of illustration only, and other embodiments may have higher or lower voltages and currents, longer or shorter holding and opening or picking phases, etc.

Figure 7:
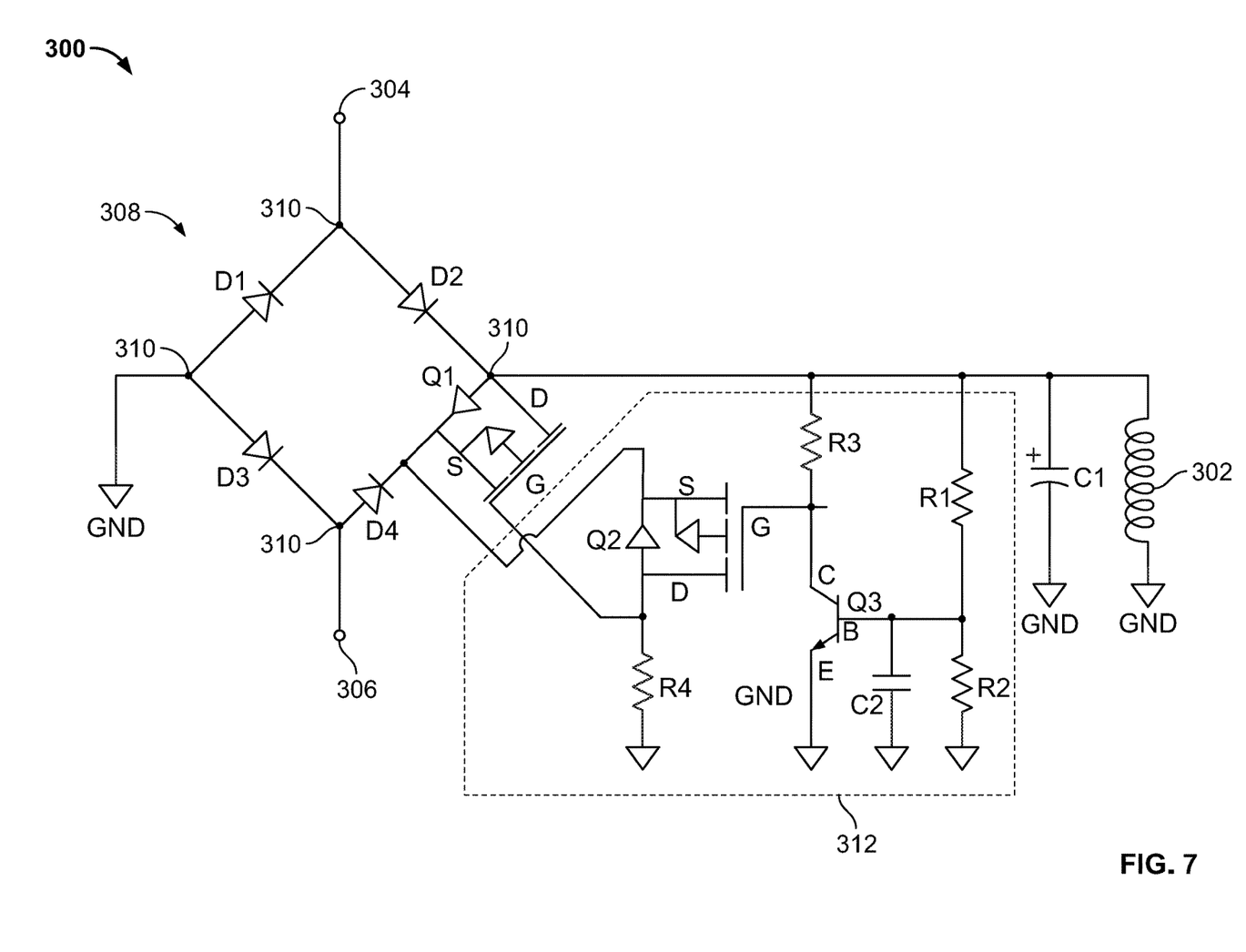
FIG. 7 is a wiring diagram of a control circuit including a trigger circuit according to another example embodiment of the present disclosure.

A control circuit 300 for supplying current to actuate a gas valve in an HVAC system according to another example embodiment is illustrated in FIG. 7. The control circuit 300 includes a solenoid coil 302 adapted to selectively open and close the gas valve in the HVAC system.

The control circuit 300 also includes input terminals 304 and 306 coupled to receive an alternating current (AC) power input. The control circuit 300 further includes a rectifier bridge 308 coupled between the input terminals 304, 306 and the solenoid coil 302 to supply current to the solenoid coil 302. The rectifier bridge 308 includes four diodes D1, D2, D3, and D4 positioned between four nodes 310. A smoothing capacitor C1 is coupled at the output. In some embodiments, excessive output voltage ripple may be present at the smoothing capacitor C1, which may reduce a life of the capacitor C1.

A switch Q1 is coupled to selectively change the rectifier bridge 308 from a full-wave rectifier when the switch Q1 is on to a half-wave rectifier 308 when the switch Q1 is off. The control circuit 300 also includes a timing circuit 312 coupled to control switching operation of the switch Q1 to change the rectifier bridge 308 from the full-wave rectifier to the half-wave rectifier once a specified time delay elapses after AC power is first applied to the input terminals 304 and 306.

As shown in FIG. 7, the timing circuit 312 (e.g., trigger circuit, etc.) includes a resistors R1, R2 and a capacitor C2 coupled in an RC circuit arrangement. The timing circuit 312 also includes a bipolar-junction transistor (BJT) Q3 having a base coupled with a terminal of the capacitor C2 and an emitter coupled with a ground potential to drain the capacitor voltage when AC power is cut off from the input terminals 304 and 306. Another switch Q2 is coupled between the BJT Q3 and the switch Q1.

The timing circuit 312 is coupled to allow the switch Q1 to maintain an on state when AC power is first applied to the input terminals 304 and 306, and turn off the switch Q1 after a specified time delay elapses. The specified time delay may correspond to an RC time constant of the timing circuit 312.

For example, when voltage is first applied to the input terminals 304 and 306, the switch Q1 may initially be on through the resistor R4 pull-down (so the rectifier bridge 308 operates as a full-wave rectifier), the switch Q2 may initially be off through the resistor R3 pull-up, and the switch Q3 may be initially off due to zero volts on the capacitor C2.

After the capacitor C2 charges to a threshold value (e.g., about 0.7 V, etc.), the switch Q3 will turn on. With the switch Q3 on, the gate of the switch Q2 is driven low to turn on the switch Q2. With the switch Q2 on, the gate of the switch Q1 is drive high to turn off the switch Q1 (so the rectifier bridge 308 acts as a half-wave rectifier).

The resistance of R1 may be greater than the resistance of R2, so the capacitor C2 drains quickly when the input voltage is switched off, leading to a quick "recycle" time. Compared to the control circuit 100 of FIG. 1 where the capacitor C2 drains out through the resistor R2 when the control circuit 100 is turned off (which may take a long time), in the control circuit 300 the capacitor C2 may only be charged to 0.7V. This may allow the capacitor C2 of the control circuit 300 to drain out very quickly through the resistor R2.

Additionally, the switch Q1 in the control circuit 100 may switch on more slowly, while the switch Q1 in the control circuit 300 may switch on more quickly (e.g., compare the voltage and current plots for the control circuit 100 in FIGS. 2 and 3 to the voltage and current plots for the control circuit 300 in FIGS. 5 and 6). The benefits of the control circuit 300 as compared to the control circuit 100 may or may not be justified in view of the higher cost and complexity of the control circuit 300, and may depend upon the application.

Figure 8:
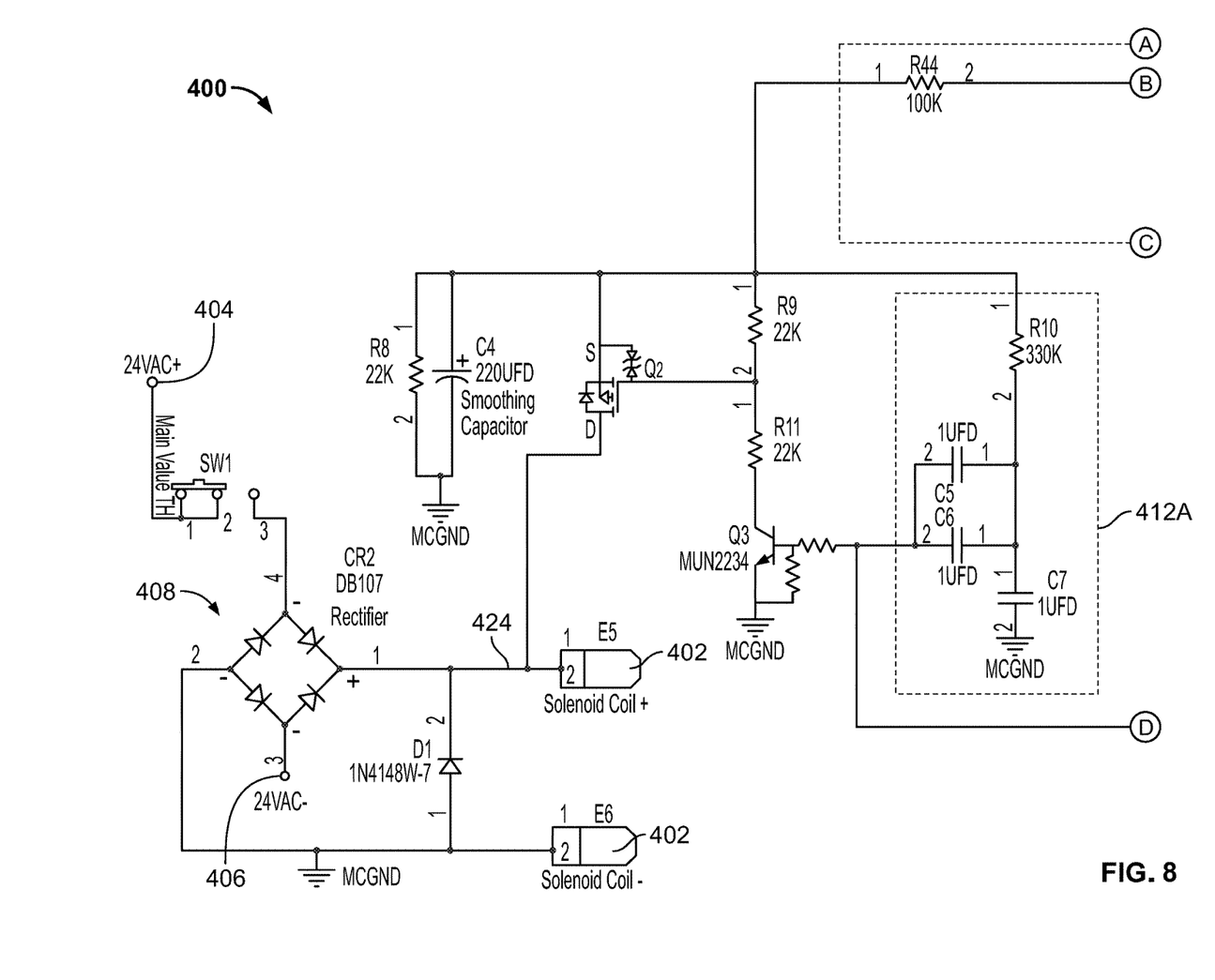
FIG. 8 is a wiring diagram of a control circuit including an optional microcontroller according to yet another example embodiment of the present disclosure.

A control circuit 400 for supplying current to actuate a gas valve in an HVAC system is illustrated in FIG. 8, according to another example embodiment of the present disclosure. The control circuit 400 includes a solenoid coil 402 adapted to selectively open and close the gas valve in the HVAC system.

The control circuit 400 also includes an input terminal 404 and 406 to receive an alternating current (AC) power input. The control circuit 400 further includes a rectifier bridge 408 coupled between the input terminals 404, 406 and the solenoid coil 402 to supply current to the solenoid coil 402.

A switch Q2 is coupled in series with a capacitor C4 (e.g., a smoothing capacitor, etc.) between a ground potential and a node 424 defined between the rectifier bridge 408 and the solenoid coil 402. The switch Q2 is coupled to selectively connect and disconnect the capacitor C4 in parallel with the solenoid coil 402, to allow the capacitor C4 to smooth the voltage rectified by the rectifier bridge 408 when the switch Q2 is on, and to inhibit smoothing of the rectified voltage by the capacitor C4 when the switch Q2 is off.

An optional timing circuit 412A is coupled to control switching operation of the switch Q2 by allowing the switch Q2 to maintain an on state when AC power is first applied to the input terminals 204, 206, and turning off the switch Q2 after a specified time delay elapses.

The timing circuit 412A includes a resistor R10, and three capacitors C5, C6, and C7. The capacitors C5 and C6 are connected in parallel, and may have the same capacitance value. In other embodiments, a single capacitor may be coupled in series with the gate of the switch Q3, more than two capacitors may be coupled in series with the gate of the switch Q3, etc., such that a capacitance value is connected in series with the gate of the switch Q3 regardless of the number of capacitors. For example, two 1 uF capacitors may be used instead of one 2.2 uF capacitor for cost savings, etc. The capacitor C7 is coupled between a ground potential, the resistor R10, and the capacitors C5 and C6. The capacitor C7 is optional, and may be used to increase the duration after power of for the timing circuit 412A to turn off the switch Q3, thereby increasing the pick duration.

A transistor Q3 is coupled to selectively enable and disable the switch Q3. The switch Q3 is coupled in series with resistors R9 and R11, between the smoothing capacitor C4 and a ground potential. A node defined between the resistors R9 and R11 is coupled to a gate of the switch Q3. A resistor R8 may provide a discharge path for the capacitor C4 and the timing circuit 412A when the 24 VAC input is removed.

In the timing circuit 412A, the resistor R10 and the capacitors C5, C6 are coupled in series between the transistor Q3 and a node defined between the smoothing capacitor C and the switch Q2. The resistor R10 and the capacitors C5, C6 are connected in an RC circuit arrangement, and the specified time delay for disconnecting the smoothing capacitor C4 may correspond to an RC time constant of the RC circuit arrangement.

For example, the RC circuit arrangement of the timing circuit 412A may drive a base of the transistor Q3 to generate the pick or hold state currents, by selectively connecting and disconnecting the smoothing capacitor C4 from the solenoid coil 402.

In the pick state, a full-wave rectified voltage from the rectifier bridge 408 is supplied to the solenoid coil 402, and the voltage is smoothed by the smoothing capacitor C4 connected in parallel with the solenoid coil. In this state, the switch Q2 and the transistor Q3 are both on. This produces a higher current and voltage at the solenoid coil 402 to pick (e.g., open) the solenoid coil 402.

In the hold state, the full-wave rectified voltage from the rectifier bridge 408 is supplied to the solenoid coil 402, and the voltage is not smoothed by the smoothing capacitor C4, because the smoothing capacitor C4 is disconnected. In this state, the switch Q2 and the transistor Q3 are both off. This produces a lower current and voltage at the solenoid coil 402 to hold the solenoid coil 402 in the open position.

Upon power up of the control circuit 400, the capacitors C5 and C6 are discharged. Current may flow from the rectifier bridge 408 through the switch Q2, the resistor R10, and the capacitors C5 and C6, to turn on the transistor Q3. The transistor Q3 turns on the switch Q2 (or maintains the switch Q2 in an on state), and the capacitor C4 is connected in parallel with the solenoid coil 402 for the pick state.

After a specified time delay (e.g., corresponding to an RC time constant of the resistor R10 and the capacitors C5 and C6, etc.), the capacitors C5 and C6 will be charged. This will stop current flow to the transistor Q3, thereby turning off the switch Q2 and disconnecting the smoothing capacitor C4 from the solenoid coil 402 for the hold state.

Another optional trigger circuit 412B is also illustrated in FIG. 8. The control circuit 400 may include only the trigger circuit 412A, only the trigger circuit 412B, etc., depending on the desired application of the control circuit 400. As shown in FIG. 8, the optional trigger circuit 412B includes a microcontroller 426.

The microcontroller 426 is coupled to control switching operation of the transistor Q3 to selectively connect and disconnect the smoothing capacitor C4 in parallel with the solenoid coil 402. For example, an output of the microcontroller 426 is coupled between a base of the transistor Q3 and a node defined between the switch Q2 and the smoothing capacitor C4.

The microcontroller 426 may drive the base of the transistor Q3 high during the pick state to connect the smoothing capacitor C4 in parallel with the solenoid coil, and drive the base of the transistor Q3 low after a specified time delay to disconnect the smoothing capacitor C4 from the solenoid coil 402.

The specified time delay may be stored in a memory of the microcontroller 426, and the microcontroller 426 may control switching operation of the transistor Q3 according to computer-executable instructions stored in memory and executed by a processor of the microcontroller 426, logic gates of the microcontroller, other software and/or hardware features of the microcontroller 426, etc.

The microcontroller 426 may allow for a user to specify any desired time delay via the microcontroller 426, quickly adjust the specified time delay without changing circuit components or RC resistance and capacitance values, etc. The microcontroller 426 may also inhibit (e.g., eliminate, etc.) a reset time that may otherwise be present in an RC circuit, as the microcontroller 426 would not have to wait for capacitor(s) to discharge, etc.

The trigger circuit 412B may include a phototransistor 428 (and/or other isolator) to electrically isolate the microcontroller 426 from the transistor Q3, from other components of the control circuit 400, etc.

The component and parameter values in FIG. 8 are provided for purposes of illustration only, and other embodiments may have other component values, components coupled in other circuit arrangements, etc.

As described above, the elements R8, C4, Q2, R9, R11, Q3, R10, C5, C6, and C7 may be considered as a pick and hold circuit. The pick and hold circuit may be powered via CR2 pin 1 through the internal body diode in the switch Q2. This body diode points from Q2-D (e.g., a drain of the switch Q2) to Q2-S (e.g., a source of the switch Q2), and is illustrated in FIG. 8 as a portion of the schematic symbol for the switch Q2.

In effect, the switch Q2, when OFF, may prevent current flow from Q2-S to Q2-D, but the switch Q2 may not block current from Q2-D to Q2-S because the current will flow across the body diode. When 24 VAC is supplied to the input 404, the switch Q2 will briefly be in an OFF state because Q2-G (e.g., the gate of the switch Q2) is not at a lower voltage than Q2-S. Current will flow from CR2 pin 1 across the FET's body diode to the node C4+ of the capacitor C4, then through the resistor R10 and parallel connected capacitors C5 and C6, thereby turning on the transistor Q3. This holds Q2-G to roughly half the voltage of C4+ (because of the voltage divider including resistors R9 and R11).

Once the voltage on C4+ rises enough so that Q2-G is lower than Q2-S by Vgs(th) (e.g., the gate to source threshold voltage of the switch Q2), then the switch Q2 may turn ON and the capacitor C4 will be in parallel with the solenoid coil 402. The switch Q2 may switch on very quickly after power up (e.g., much less than one half line cycle) and may remain on until the transistor Q3 is turned off.

Example embodiments described herein may provide one or more (or none) of the following advantages: stronger picking or opening of a gas valve, less heat rise during the holding phase of a gas valve, less magnet wire required in solenoid construction, reduced energy consumption during operation, smaller coils and gas valve sizes, etc.

The example embodiments may be used in any suitable application that includes gas valve(s) with solenoid actuator(s). For example, the control circuits may be particularly useful for gas valves with DC solenoid actuators that require a greater magnetic force to open or pick than the force required to stay open or hold.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally," "about," and "substantially," may be used herein to mean within manufacturing tolerances. Whether or not modified by the term "about," the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A control circuit for supplying current to actuate a gas valve in an HVAC system, the control circuit comprising:
   a solenoid coil adapted to selectively open and close the gas valve in the HVAC system;
   input terminals coupled to receive an alternating current (AC) power input;
   a rectifier bridge coupled between the input terminals and the solenoid coil to supply current to the solenoid coil;
   a capacitor; and
   a switch coupled in series with the capacitor between a ground potential and a node defined between the rectifier bridge and the solenoid coil, the switch coupled to selectively electrically connect and disconnect the capacitor in parallel with the solenoid coil to allow the capacitor to smooth the voltage rectified by the rectifier bridge when the switch is on and to inhibit smoothing of the rectified voltage by the capacitor when the switch is off.

2. The control circuit of claim 1, wherein:
   the control circuit is coupled to supply a first current to the solenoid coil when the switch is on and the capacitor is electrically connected in parallel with the solenoid coil to smooth the voltage rectified by the rectifier bridge, and to supply a second current to the solenoid coil when the switch is off and the capacitor is electrically disconnected from the solenoid coil to inhibit smoothing the voltage rectified by the rectifier bridge; and
   a value of the first current is greater than a value of the second current.

3. The control circuit of claim 2, wherein:
   the value of the first current is greater than or equal to a first threshold for opening the gas valve via the solenoid coil; and
   the value of the second current is less than the first threshold and greater than or equal to a second threshold for holding the gas valve in an open position via the solenoid coil.

4. The control circuit of claim 1, wherein the switch comprises a p-channel metal-oxide semiconductor field-effect transistor (MOSFET).

5. The control circuit of claim 1, further comprising a timing circuit coupled to control switching operation of the switch by allowing the switch to maintain an on state when AC power is first applied to the input terminals and turning off the switch after a specified time delay elapses.

6. The control circuit of claim 5, wherein the timing circuit comprises at least one resistor and at least one timing capacitor coupled in a resistor-capacitor (RC) circuit arrangement, and the specified time delay corresponds to an RC time constant of the RC circuit arrangement.

7. The control circuit of claim 6, wherein the timing circuit further comprises at least one transistor coupled between the RC circuit arrangement and the switch.

8. The control circuit of claim 7, wherein:
   the at least one timing capacitor comprises two capacitors coupled in parallel; and
   the resistor is coupled in series with the two timing capacitors between the switch and the transistor.

9. The control circuit of claim 6, wherein the timing circuit further comprises a microcontroller coupled to selectively enable and disable the transistor.

10. The control circuit of claim 9, wherein the timing circuit further comprises a phototransistor coupled between the microcontroller and the transistor to electrically isolate the microcontroller.

11. The control circuit of claim 6, wherein:
    the timing circuit further comprises a diode;
    the at least one resistor includes at least two resistors coupled in series with the diode between the rectifier bridge and a ground potential;
    a node defined between the at least two resistors is coupled to the switch; and
    a first terminal of the timing capacitor is coupled with the ground potential and a second terminal of the timing capacitor is coupled between the switch and the node defined between the at least two resistors.

12. A gas valve assembly comprising a gas valve including the control circuit of claim 1.

13. A furnace control assembly comprising an integrated furnace control (IFC) including the control circuit of claim 1.

14. A control circuit for supplying current to actuate a gas valve in an HVAC system, the control circuit comprising:
    a solenoid coil adapted to selectively open and close the gas valve in the HVAC system;
    input terminals coupled to receive an alternating current (AC) power input;
    a rectifier bridge coupled between the input terminals and the solenoid coil to supply current to the solenoid coil, the rectifier bridge including four nodes and at least four diodes each connected between a corresponding pair of the four nodes;
    a switch coupled between one of the pairs of the four nodes of the rectifier bridge to selectively change the rectifier bridge from a full-wave rectifier when the switch is on to a half-wave rectifier when the switch is off; and
    a timing circuit coupled to control switching operation of the switch by allowing the switch to maintain an on state when AC power is first applied to the input terminals and turning off the switch after a specified time delay elapses.

15. The control circuit of claim 14, wherein:
    the control circuit is coupled to supply a first current to the solenoid coil when the switch is on and the rectifier bridge is operating as a full-wave rectifier, and to supply a second current to the solenoid coil when the switch is off and the rectifier bridge is operating as a half-wave rectifier; and a value of the first current is greater than a value of the second current.

16. The control circuit of claim 15, wherein:
the value of the first current is greater than or equal to a first threshold for opening the gas valve via the solenoid coil; and
the value of the second current is less than the first threshold and greater than or equal to a second threshold for holding the gas valve in an open position via the solenoid coil.

17. The control circuit of claim 14, wherein the timing circuit comprises at least one resistor and at least one capacitor coupled in a resistor-capacitor (RC) circuit arrangement, and the specified time delay corresponds to an RC time constant of the RC circuit arrangement.

18. The control circuit of claim 14, wherein:
the timing circuit further comprises a diode;
the at least one resistor includes at least two resistors coupled in series with the diode between the rectifier bridge and a ground potential;
a node defined between the at least two resistors is coupled to the switch; and
a first terminal of the capacitor is coupled with the ground potential and a second terminal of the capacitor is coupled between the switch and the node defined between the at least two resistors.

19. The control circuit of claim 14, wherein the timing circuit includes at least one resistor and at least one capacitor coupled in a resistor-capacitor (RC) circuit arrangement and a bipolar-junction transistor (BJT) having a base coupled with a terminal of the capacitor and an emitter coupled with a ground potential to drain the capacitor voltage when AC power is cut off from the input terminals.

20. The control circuit of claim 19, wherein the switch is a first switch, and the timing circuit further comprises a second switch coupled between the BJT and the first switch.

* * * * *